United States Patent
Yu et al.

(10) Patent No.: US 8,817,553 B2
(45) Date of Patent: Aug. 26, 2014

(54) CHARGE PUMP CONTROL SCHEME USING FREQUENCY MODULATION FOR MEMORY WORD LINE

(75) Inventors: Hung-Chang Yu, Hsinchu (TW); Yue-Der Chih, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 184 days.

(21) Appl. No.: 13/052,637

(22) Filed: Mar. 21, 2011

(65) Prior Publication Data

US 2012/0134218 A1 May 31, 2012

Related U.S. Application Data

(60) Provisional application No. 61/418,224, filed on Nov. 30, 2010.

(51) Int. Cl.
  *G11C 7/06* (2006.01)
  *G11C 5/14* (2006.01)
  *G11C 7/10* (2006.01)
  *G11C 8/08* (2006.01)

(52) U.S. Cl.
  CPC .............. *G11C 7/1006* (2013.01); *G11C 5/147* (2013.01); *G11C 8/08* (2013.01)
  USPC ................. 365/189.07; 365/189.09; 365/226; 365/227

(58) Field of Classification Search
  CPC ....... G11C 5/14; G11C 5/147; G11C 11/4074
  USPC .......................... 365/189.07, 189.09, 226, 227
  See application file for complete search history.

(56) References Cited

U.S. PATENT DOCUMENTS

| | | | |
|---|---|---|---|
| 6,343,044 B1 * | 1/2002 | Hsu et al. ...................... 365/227 |
| 2003/0147287 A1 * | 8/2003 | Lee ........................... 365/189.09 |
| 2007/0109700 A1 * | 5/2007 | Shimogawa et al. ........... 361/57 |

* cited by examiner

*Primary Examiner* — Tha-O H Bui
(74) *Attorney, Agent, or Firm* — Lowe Hauptman & Ham, LLP

(57) ABSTRACT

A memory includes a word line having a word line voltage, a charge pump coupled to the word line, and a dynamic feedback control circuit coupled to the charge pump. The dynamic feedback control circuit is capable of changing a clock frequency of a clock signal supplied the charge pump from a first non-zero value to a second non-zero value depending on the difference between the word line voltage and a target threshold voltage.

19 Claims, 4 Drawing Sheets

CHARGE PUMP CONTROL SCHEME USING FREQUENCY MODULATION FOR MEMORY WORD LINE

CROSS-REFERENCES TO RELATED APPLICATIONS

The present application claims priority of U.S. Provisional Patent Application Ser. No. 61/418,224, filed on Nov. 30, 2010, which is incorporated herein by reference in its entirety. Also, the present application is related to U.S. application Ser. No. 12/970,123, entitled "CHARGE PUMP CONTROL SCHEME FOR MEMORY WORD LINE" filed on Dec. 16, 2010, which is incorporated herein by reference.

TECHNICAL FIELD

The present disclosure relates generally to an integrated circuit, and more particularly to a charge pump.

BACKGROUND

In a memory, e.g., a flash memory, sometimes the voltage level of a word line needs to be boosted to a level higher than a power supply voltage VCC in order to compensate for the variation of a memory cell current due to process limitations and also to more efficiently complete a function, e.g., a read function. Once the word line voltage is boosted, some circuits use a continuous charge pump operation to sustain the boosted voltage level by continuously supplying current. However, continuous charge pump operation results in extra power consumption.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
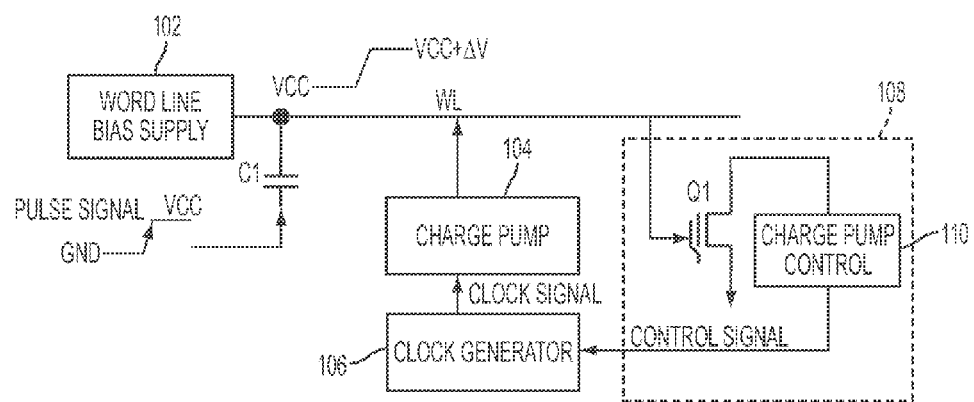
FIG. 1 is a high level functional diagram showing an exemplary charge pump power management circuit for a memory according to some embodiments.

FIG. 1 is a high-level functional diagram showing an exemplary charge pump power management circuit for a memory according to some embodiments. A word line bias supply 102, a boost capacitor C1, a charge pump 104, and a dynamic feedback control circuit 108 are coupled to a word line WL. A clock generator 106 is coupled and supplies a clock signal to the charge pump 104. The clock generator 106 is controlled by a charge pump control circuit 110 of the dynamic feedback control circuit 108.

A memory cell Q1, e.g., a flash memory cell, is used to detect the WL voltage level in the dynamic feedback control circuit 108, e.g., by detecting the cell current I_cell flowing through the memory cell Q1. The memory cell Q1 has similar I-V characteristics as those of other neighboring normal memory cells (not shown) in the memory, and it will have similar local process, voltage, and temperature (PVT) variations as the neighboring normal memory cells. The status of the memory cell Q1 can be set as necessary for each application. For example, the status of the memory cell Q1 can be set (e.g., having a logical 1 or a logical 0, etc.) to represent the most conductive situation. In one embodiment, the pre-charge state of the floating gate of the memory cell Q1 is in an "erased" state.

During a read operation, the word line WL is initially supplied a power supply voltage VCC. Then a pulse signal coupled to the boost capacitor C1 is raised from GND to VCC, and the WL voltage level (the voltage level at the word line WL) is boosted from VCC to VCC+ΔV through the boost capacitor C1. If the WL voltage level is maintained at VCC+ΔV, or no lower than a threshold voltage V_th, the dynamic feedback control circuit 108 disables the clock generator 106 (and the charge pump 104) in order to reduce power consumption. For example, a clock signal frequency from the clock generator 106 is zero. In at least one embodiment, V_th is greater than VCC.

If the WL voltage level decreases below the threshold voltage V_th, the dynamic feedback control circuit 108 detects the current decrease in the memory cell Q1 (by comparing I_cell to a reference current value, e.g., I_ref1, in FIG. 2) and generates a control signal (e.g., I_clk in FIG. 2) to activate the clock generator 106. The clock generator 106 sends out series of clock signals to enable the charge pump 104 that pumps charges to raise the WL voltage level back up to the voltage level above V_th.

The clock generator 106 modulates the frequency of the clock signal supplied to the charge pump 104 depending on the control signal from the charge pump control circuit 110 in the dynamic feedback control circuit 108. For example, the lower the WL voltage is compared to V_th (e.g., the higher the current difference is between I_cell and I_ref1), the faster is the frequency of the clock signal (e.g., the frequency of the clock signal is changed from a first non-zero value to a second non-zero value that is greater than the first non-zero value). With the frequency modulation of the clock signal to the charge pump 104 from the clock generator 106, the WL voltage is efficiently maintained at V_th, as described in further detail below.

Figure 2:
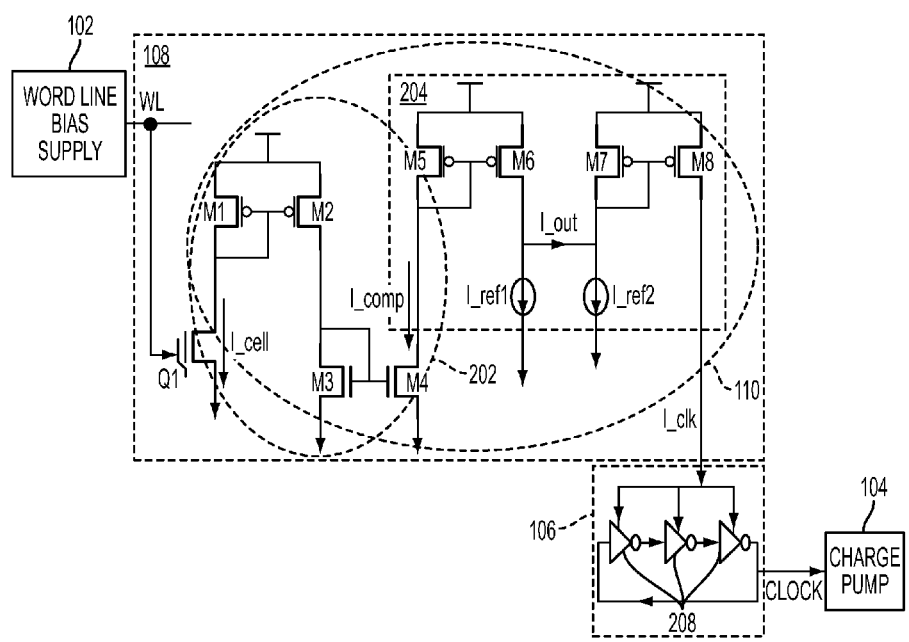
FIG. 2 is a schematic diagram showing an exemplary implementation of the charge pump power management circuit in FIG. 1 according to some embodiments.

FIG. 2 is a schematic diagram showing an exemplary implementation of the charge pump power management circuit in FIG. 1 according to some embodiments. The dynamic feedback control circuit 108 comprises the memory cell Q1, a current detection circuit 202, and a feedback control circuit 204. In this embodiment, the current detection circuit 202 is implemented with a current mirror circuit having P-channel Metal-Oxide-Semiconductor (PMOS) transistors M1 and M2, and N-channel Metal-Oxide-Semiconductor (NMOS) transistors M3 and M4; and the feedback control circuit 204 is implemented with current sources I_ref1 and I_ref2, and PMOS transistors M5, M6, M7, and M8.

The current through the memory cell Q1 is I_cell, which varies according to the WL voltage. The memory cell Q1 is used to monitor the fluctuation of the WL voltage level (by detecting the memory cell Q1's current variation). I_comp is a duplicate of I_cell by the current detection circuit 202 (using a current mirror configuration). I_comp is first compared with I_ref1 by a comparator circuit including PMOS transistors M5 and M6 (in a current mirror configuration) to generate a current output I_out in the feedback control circuit 204. In one embodiment, I_ref1 is chosen to represent the I_cell when the WL voltage is equal to V_th. A control signal I_clk proportional to (I_ref2-I_out) is generated using PMOS transistors M7 and M8 (in a current mirror configuration).

The control signal I_clk is supplied to the clock generator 106. The clock generator 106 in this example is implemented by a ring oscillator using odd numbers of inverters 208, e.g., three inverters 208, controlled by the I_clk as the bias to the inverters 208. As I_clk increases or decreases, the frequency of the clock signal generated by the clock generator 106 also increases or decreases, respectively.

In this embodiment, the feedback control circuit 204 generates the control signal I_clk depending on I_out, i.e., the difference between I_comp (or I_cell) and I_ref1, which modulates the output frequency of the clock generator 106. The clock frequency is higher when there is a bigger difference between I_comp and I_ref1 and the clock frequency is lower when there is a smaller difference between I_comp and I_ref1.

For example, if I_comp (i.e., I_cell) increases, I_out also increases, thus I_clk decreases and the clock signal frequency from the clock generator 106 decreases (assuming I_out is less than I_ref2). For example, the frequency of the clock signal is changed from a first non-zero value to a second non-zero value that is less than the first non-zero value. If I_comp (i.e., I_cell) decreases, I_out also decreases, thus I_clk increases and the clock signal frequency from the clock generator 106 increases (assuming I_out is less than I_ref2). For example, the frequency of the clock signal is changed from a first non-zero value to a second non-zero value that is greater than the first non-zero value. If I_out is greater than I_ref2 (e.g., when the WL voltage is greater than V_th by a desired margin $\Delta V$), the clock generator 106 is disabled (e.g., the frequency of the clock signal is zero).

I_ref1, I_ref2, and V_th are determined based on the required specifications for the WL voltage and the specific implementation of the charge pump control circuit 110 in each application. For example, I_ref1 can be set to a current value so that the WL voltage is maintained at or above V_th. And I_ref2 can be set having the current value so that the I_clk generated in the feedback control circuit 204 will be in an appropriate range as a bias for the clock generator 106 in FIG. 2. (This can be verified, for example, by simulation tools for specific implementations.)

Figure 3:
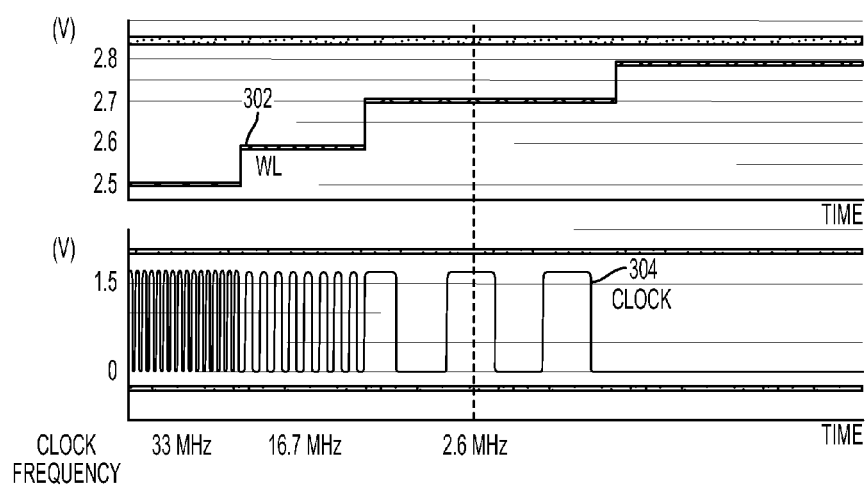
FIG. 3 is a plot showing waveforms of the exemplary charge pump power management circuit in FIG. 2 according to some embodiments.

FIG. 3 is a plot showing waveforms of the exemplary charge pump power management circuit in FIG. 2 according to some embodiments. In this example, the control signal I_clk from the charge pump control circuit 110 controls and modulates the clock signal frequency of the clock generator 106. The clock frequency is higher when there is a bigger difference between I_comp and I_ref1 and the clock frequency is lower when there is a smaller difference between I_comp and I_ref1. In the clock waveform 304, the difference between I_comp and I_ref1 is reduced as the time passes, and the clock frequency is decreased (smaller number of pulses for a given time). The corresponding WL voltage waveform 302 shows that the WL voltage starting from 2.5 V is increased to a desired voltage at 2.8 V.

The power consumption of the charge pump 104 is reduced greatly by modulating the clock frequency. In one example, the current consumption of the charge pump 104 is reduced 89.1%, from 234 µA when not changing the clock frequency, to 25.7 µA when modulating the clock frequency. In another example, the current consumption of the charge pump 104 is reduced 93.7%, from 520 µA when not changing the clock frequency, to 32.6 µA when modulating the clock frequency.

Figure 4:
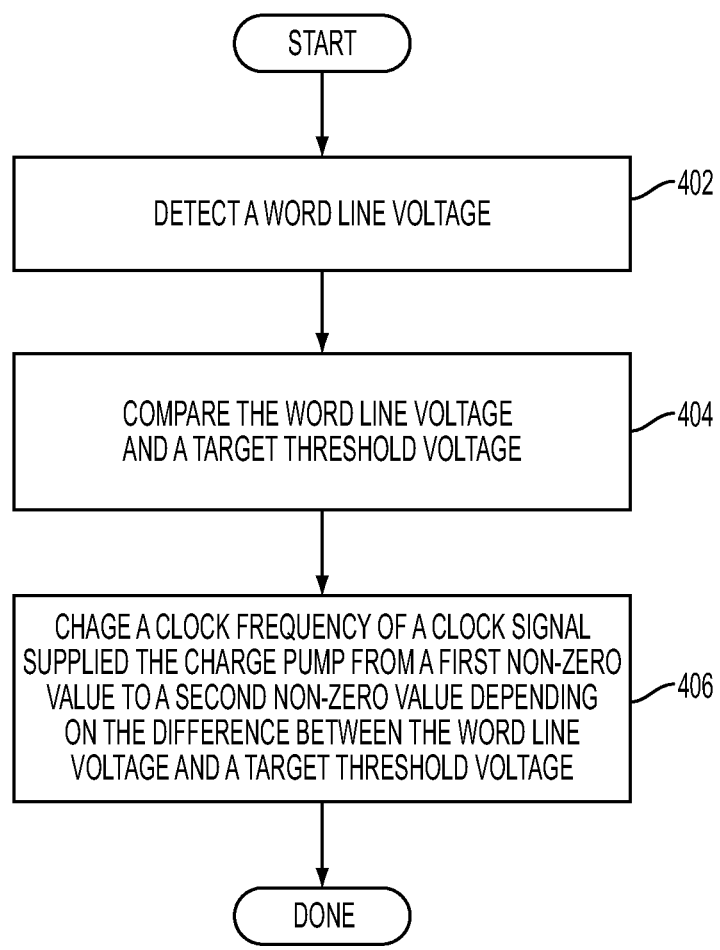
FIG. 4 is a flowchart for a method of charge-pumping using the exemplary charge pump power management circuit in FIG. 1 according to some embodiments.

FIG. 4 is a flowchart for a method of charge-pumping using the exemplary charge pump power management circuit in FIG. 1 according to some embodiments. At step 402, a word line voltage is detected. At step 404, the word line voltage and a target threshold voltage are compared. At step 406, a clock frequency of a clock signal supplied the charge pump is changed from a first non-zero value to a second non-zero value depending on the difference between the word line voltage and a target threshold voltage.

In various embodiments, the clock frequency is changed to a zero if the word line voltage is above the target threshold voltage. The clock frequency is changed from a zero to the first non-zero value if the word line voltage is below the target threshold voltage. A control signal is supplied to a clock generator coupled to the charge pump.

In various embodiments, detecting the word line voltage includes detecting a cell current in a memory cell of the memory. Detecting the cell current comprises duplicating the cell current utilizing a current mirror circuit. The cell current is compared to a reference current, e.g., I_ref1.

According to some embodiments, a memory includes a word line having a word line voltage, a charge pump coupled to the word line, and a dynamic feedback control circuit coupled to the charge pump. The dynamic feedback control circuit is capable of changing a clock frequency of a clock signal supplied the charge pump from a first non-zero value to a second non-zero value depending on the difference between the word line voltage and a target threshold voltage.

According to some embodiments, a method for a charge pump coupled to a word line of a memory includes detecting a word line voltage. The word line voltage and a target threshold voltage are compared. A clock frequency of a clock signal supplied the charge pump is changed from a first non-zero value to a second non-zero value depending on the difference between the word line voltage and a target threshold voltage.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:
1. A memory, comprising:
a word line having a word line voltage;

a charge pump coupled to the word line; and
a dynamic feedback control circuit coupled to the charge pump,
wherein the dynamic feedback control circuit is configured to change a clock frequency of a clock signal supplied to the charge pump from a first non-zero frequency to a second non-zero frequency depending on a difference between the word line voltage and a target threshold voltage, and the dynamic feedback control circuit is further configured to cause the charge pump to boost the word line voltage to a predetermined voltage value greater than the target threshold voltage on demand, change the clock frequency to a zero frequency if the word line voltage is above the predetermined voltage value, and change the clock frequency from a zero frequency to the first non-zero frequency if the word line voltage is below the target threshold voltage.

2. The memory of claim 1, further comprising a clock generator coupled between the charge pump and the dynamic feedback control circuit, wherein the clock generator generates the clock signal.

3. The memory of claim 2, wherein the clock generator is a ring oscillator comprising an odd number of inverters.

4. The memory of claim 2, wherein the dynamic feedback control circuit comprises a memory cell and a current detection circuit, wherein the current detection circuit is configured to detect a cell current of the memory cell.

5. The memory of claim 4, wherein the current detection circuit comprises a current mirror circuit.

6. The memory of claim 5, wherein the current minor circuit comprises a first PMOS transistor and a second PMOS transistor, wherein a first drain of the first PMOS transistor is coupled to a first gate of the first PMOS transistor, a second gate of the second PMOS transistor, and the memory cell.

7. The memory of claim 6, wherein the current mirror circuit further comprises a first NMOS transistor and a second NMOS transistor, wherein a second drain of the second PMOS transistor is coupled to a third drain of the first NMOS transistor, a third gate of the first NMOS transistor, and a fourth gate of the second NMOS transistor.

8. The memory of claim 4, wherein the dynamic feedback control circuit further comprises a feedback control circuit coupled to the current detection circuit, wherein the feedback control circuit is configured to generate a control signal for the clock generator.

9. The memory of claim 8, wherein the feedback control circuit comprises a comparator circuit configured to compare the cell current to a reference current, and the feedback control circuit is configured to modulate the clock frequency from the clock generator based on a comparison output from the comparator circuit.

10. A method of charge-pumping a word line of a memory using a charge pump coupled to the word line, comprising:
detecting a word line voltage;
comparing the word line voltage and a target threshold voltage;
changing a clock frequency of a clock signal supplied to the charge pump from a first non-zero frequency to a second non-zero frequency depending on the difference between the word line voltage and the target threshold voltage;
boosting the word line voltage to a predetermined voltage value greater than the target threshold voltage on demand;
changing the clock frequency to a zero frequency if the word line voltage is above the predetermined voltage value; and
changing the clock frequency from a zero frequency to the first non-zero frequency if the word line voltage is below the target threshold voltage.

11. The method of claim 10 further comprising changing the clock frequency to a zero frequency if the word line voltage is above the target threshold voltage.

12. The method of claim 10 further comprising changing the clock frequency from a zero frequency to the first non-zero frequency if the word line voltage is below the target threshold voltage.

13. The method of claim 10 further comprising supplying a control signal to a clock generator coupled to the charge pump.

14. The method of claim 10, wherein detecting the word line voltage comprises detecting a cell current in a memory cell of the memory.

15. The method of claim 14, wherein detecting the cell current comprises duplicating the cell current utilizing a current mirror circuit.

16. The method of claim 14 further comprising comparing the cell current to a reference current.

17. A memory, comprising:
a word line having a word line voltage;
a charge pump coupled to the word line;
a clock generator configured to supply a clock signal to the charge pump; and
a dynamic feedback control circuit coupled to the clock generator, the dynamic feedback control circuit comprising:
a memory cell;
a current detection circuit, wherein the current detection circuit is configured to detect a cell current of the memory cell; and
a feedback control circuit coupled to the current detection circuit, wherein the feedback control circuit is configured to generate a control signal for the clock generator,
wherein the dynamic feedback control circuit is configured to change a clock frequency of the clock signal from a first non-zero frequency to a second non-zero frequency depending on a difference between the word line voltage and a target threshold voltage, and the dynamic feedback control circuit is further configured to cause the charge pump to boost the word line voltage to a predetermined voltage value greater than the target threshold voltage on demand, change the clock frequency to a zero frequency if the word line voltage is above the predetermined voltage value, and change the clock frequency from a zero frequency to the first non-zero frequency if the word line voltage is below the target threshold voltage.

18. The memory of claim 17, wherein the current detection circuit comprises a current mirror circuit and the feedback control circuit comprises a comparator circuit.

19. The memory of claim 17, wherein the clock generator is a ring oscillator comprising an odd number of inverters.

* * * * *